(12) United States Patent
Moriyama et al.

(10) Patent No.: US 9,741,598 B2
(45) Date of Patent: Aug. 22, 2017

(54) PROTECTIVE TAPE AND METHOD FOR MANUFACTURING A SEMICONDUCTOR DEVICE USING THE SAME

(71) Applicant: DEXERIALS CORPORATION, Tokyo (JP)

(72) Inventors: Hironobu Moriyama, Tokyo (JP); Shingo Deguchi, Tokyo (JP); Hidekazu Yagi, Tokyo (JP); Tomoyuki Ishimatsu, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/761,913

(22) PCT Filed: Aug. 18, 2014

(86) PCT No.: PCT/JP2014/071532
§ 371 (c)(1),
(2) Date: Jul. 17, 2015

(87) PCT Pub. No.: WO2015/162808
PCT Pub. Date: Oct. 29, 2015

(65) Prior Publication Data
US 2016/0181140 A1    Jun. 23, 2016

(30) Foreign Application Priority Data
Apr. 22, 2014  (JP) ................. 2014-088627

(51) Int. Cl.
*H01L 21/78*   (2006.01)
*H01L 21/683*  (2006.01)
(Continued)

(52) U.S. Cl.
CPC .......... *H01L 21/6836* (2013.01); *B32B 27/00* (2013.01); *C09J 7/02* (2013.01);
(Continued)

(58) Field of Classification Search
None
See application file for complete search history.

(56) References Cited

U.S. PATENT DOCUMENTS

2005/0008873 A1  1/2005  Noro et al.
2006/0204749 A1  9/2006  Kita et al.
(Continued)

FOREIGN PATENT DOCUMENTS

JP  2005-028734 A  2/2005
JP  2012-074623 A  4/2012
(Continued)

OTHER PUBLICATIONS

Jan. 20, 2015 International Search Report issued in Application No. PCT/JP2014/071532.

*Primary Examiner* — Duy T Nguyen
*Assistant Examiner* — Bo Bin Jang
(74) *Attorney, Agent, or Firm* — Oliff PLC

(57) ABSTRACT

A protective tape and a method for manufacturing a semiconductor device using the same capable of achieving excellent connection properties. The protective tape includes an adhesive layer, a thermoplastic resin layer and a backing material film in that order; a modulus ratio of a shear storage modulus of the adhesive layer to a shear storage modulus of the thermoplastic resin layer at an application temperature at which the protective tape is applied is 0.01 or less. This suppresses resin residue on bumps thereby achieving excellent connection properties.

9 Claims, 5 Drawing Sheets

(51) Int. Cl.
  *B32B 27/00* (2006.01)
  *C09J 7/02* (2006.01)
  *H01L 21/304* (2006.01)
  *H01L 23/31* (2006.01)

(52) U.S. Cl.
  CPC ............ *H01L 21/304* (2013.01); *H01L 21/78* (2013.01); *H01L 23/3142* (2013.01); *H01L 2224/13* (2013.01); *H01L 2924/0002* (2013.01)

(56) References Cited

U.S. PATENT DOCUMENTS

| | | |
|---|---|---|
| 2009/0075429 A1 | 3/2009 | Sato et al. |
| 2012/0208350 A1 | 8/2012 | Oda et al. |
| 2012/0273975 A1 | 11/2012 | Hayashishita et al. |

FOREIGN PATENT DOCUMENTS

| | | |
|---|---|---|
| JP | 2012-169484 A | 9/2012 |
| JP | 2013-087131 A | 5/2013 |
| JP | 2014-017336 A | 1/2014 |
| WO | 2006/014000 A1 | 2/2006 |
| WO | 2006/118033 A1 | 11/2006 |
| WO | 2011/152045 A1 | 12/2011 |
| WO | 2012/026431 A1 | 3/2012 |

PROTECTIVE TAPE AND METHOD FOR MANUFACTURING A SEMICONDUCTOR DEVICE USING THE SAME

TECHNICAL FIELD

The present invention relates to a protective tape used in manufacturing semiconductor devices and also relates to a method for manufacturing a semiconductor device using the same. This application claims priority to Japanese Patent Application No. 2014-088627 filed on Apr. 22, 2014, the entire content of which is hereby incorporated by reference.

BACKGROUND ART

Conventional post-processing in manufacturing processes of flip-chip mounting semiconductors is performed in the following manner First, adhesive sheets or tapes, which are known as back grind tape, is applied to a bump electrode formation surface of a wafer having bump electrodes formed thereon and a side opposite to the bump electrode formation surface is ground to a predetermined thickness in this configuration. After completion of the grinding, the back grind tape is peeled off and the wafer is diced to obtain individual semiconductor chips. Next, the semiconductor chips are flip-chip mounted onto other semiconductor chips or substrates. Additionally, pre-applied or post-applied type underfill is cured to reinforce the semiconductor chip.

In recent years, there have been investigated methods using a laminated material including a thermosetting resin layer and a thermoplastic resin layer as a back grind tape wherein only the thermosetting resin layer is left on the wafer and other layers are removed (for example, see PLT 1).

Unfortunately, in the back grind tape described above, when leaving the thermosetting resin layer on the wafer and removing the other layers, resin remaining on the bumps, for example during reflow, might obstruct solder bonding and degrade connection properties.

PRIOR ART LITERATURE

Patent Literatures

PLT 1: Japanese Unexamined Patent Application Publication No. 2005-28734

SUMMARY OF THE INVENTION

Problem to be Solved by the Invention

In view of the foregoing, the object of the present invention is to provide a protective tape and a method for manufacturing a semiconductor device using the same which are capable of achieving excellent connection properties.

Means for Solving the Problem

To solve the aforementioned problem, a protective tape according to the present invention includes an adhesive layer, a thermoplastic resin layer and a backing material film layer in that order and a modulus ratio of a shear storage modulus of the adhesive layer to a shear storage modulus of the thermoplastic resin layer at an application temperature at which the protective tape is applied is 0.01 or less.

Furthermore, a method for manufacturing a semiconductor device according to the present invention includes a protective tape application step of applying a protective tape having an adhesive layer onto a wafer surface having bump electrodes forming thereon, a grinding step of grinding a surface opposite to the surface of application of the protective tape and a peeling step of peeling the protective tape such that the adhesive layer remains and other layers are removed; the protective tape includes the adhesive layer, a thermoplastic resin layer, and a backing material film layer in that order, and a modulus ratio of a shear storage modulus of the adhesive layer to a shear storage modulus of the thermoplastic resin layer at an application temperature at which the protective tape is applied is 0.01 or less.

Additionally, a semiconductor device according to the present invention is achievable by using the aforementioned method for manufacturing a semiconductor device.

Effects of the Invention

Excellent connection properties are achievable in the present invention when removing the layers other than the adhesive layer, because resin residue on bumps is suppressed by the modulus ratio of the shear storage modulus of the adhesive layer to the shear storage modulus of the thermoplastic resin layer being 0.01 or less at the application temperature.

DESCRIPTION OF THE EMBODIMENTS

Embodiments of this invention will now be described in detail according to the following order.
1. Protective Tape
2. Method for Manufacturing a Semiconductor Device
3. Examples
   <1. Protective Tape>
A protective tape according to the present invention includes an adhesive layer, a thermoplastic resin layer and a backing material film layer in that order and a modulus ratio of a shear storage modulus of the adhesive layer to a shear storage modulus of the thermoplastic resin layer at an application temperature at which the protective tape is applied is 0.01 or less and preferably 0.00001 or more and 0.005 or less. Excellent connection properties are achievable when removing the layers other than the adhesive layer, because resin residue on bumps is suppressed. One possible reason for this is that the adhesive layer having excellent deformation and fluidity properties in comparison to the thermoplastic layer can suppress the adhesion of adhesive agent to the bumps during the application of the protective tape.

Figure 1:
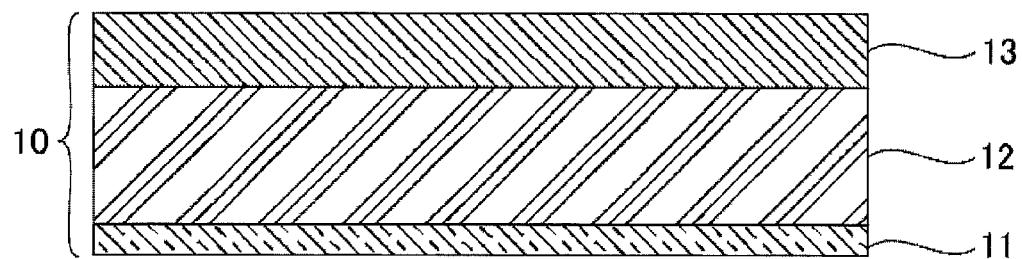
FIG. 1 is a schematic cross-sectional view illustrating a protective tape.

FIG. 1 is a cross-sectional schematic view illustrating the protective tape. A protective tape 10 is known as "back grind tape" and protects a wafer from such defects as scratches, cracks and contamination in a grinding step. As illustrated in FIG. 1, the protective tape 10 includes an adhesive layer 11, a thermoplastic resin layer 12 and a backing material film layer 13 layered in that order.

A shear storage modulus of the adhesive layer 11 at 60° C. is preferably 1.0E+01 Pa or more and 1.0E+05 Pa or less. An excessively low shear storage modulus of the adhesive layer 11 leads to resin flowing while applied to a wafer and an excessively high shear storage modulus causes non-penetration of bumps.

Thickness of the adhesive layer 11 is between 10% and 80% and preferably between 30% and 60% of the height of bump electrodes formed upon a wafer. Electrode reinforcement effects are not achievable if thickness of the adhesive layer 11 is inadequate and excessive thickness causes non-penetration of bump electrodes.

Examples of resin compositions which may be used in the adhesive layer 11 include, without particular limitation, such thermosetting types as anionic thermosetting, cationic thermosetting and radical thermosetting types and such photosetting types as cationic photosetting and radical photosetting types or a combination of these thermosetting/photosetting types may be used in approximately the same manner.

A thermosetting adhesive agent composition including film-forming resins, epoxy resins, curing agents and curing accelerators used as the adhesive layer 11 will now be explained.

As a film-forming resin, a variety of resins including phenoxy resins, epoxy resins, modified epoxy resins and urethane resins, among others, may be used. These film-forming resins may be used individually or in a combination of two or more types. Among these, in view of film-formed state and connection reliability properties, among others, a phenoxy resin is preferably used.

Examples of epoxy resins that may be used include dicyclopentadiene epoxy resins, glycidylether epoxy resins, glycidylamine epoxy resins, bisphenol A epoxy resins, bisphenol F epoxy resins, bisphenol S epoxy resins, epoxy resins having a spiro-ring, naphthalene epoxy resins, biphenyl epoxy resins, terpene epoxy resins, tetrabromobisphenol A epoxy resins, cresol novolac epoxy resins, phenol novolac epoxy resins, α-naphthalene novolac epoxy resins and brominated phenol novolac epoxy resins. These epoxy resins may be used individually or in a combination of two or more types. Among these, in view of high adhesiveness and heat resistance properties, a dicyclopentadiene epoxy resin is preferably used.

Examples of curing agents that may be used include novolac phenol resins, aliphatic amines, aromatic amines and acid anhydrides; these curing agents may be used individually or in a combination of two or more types. Among these, in view of crosslink density in a cured resin, a novolac phenol resin is preferably used.

Examples of curing accelerators that may be used include imidazoles such as 2-methylimidazole, 2-ethylimidazole and 2-ethyl-4-methylimidazole, tertiary amines such as 1,8-Diazabicyclo[5.4.0]undec-7-ene (DBU) and 2-(dimethylaminomethyl) phenol, phosphines such as triphenylphosphine, and metallic compounds such as stannous octoate.

Additionally, other constituents such as inorganic fillers, silane coupling agents, elastomers such as acrylic rubber and pigments such as carbon black may be blended to the adhesive agent composition according to purpose.

Examples of the thermoplastic layer 12 include ethylene vinyl acetate (EVA), polyethylene, polypropylene, polyamide, polyacetal, polyethylene terephthalate, polybutylene terephthalate, fluororesins, polyphenylene sulfide, polystyrene, ABS resin, acrylic based resins, polycarbonate, polyurethane, polyvinyl chloride and polyphenylene oxide, among others; these may be used individually or in a combination of two or more.

Additionally, the shear storage modulus of the thermoplastic layer 12 at 60° C. is preferably 1.0E+07 Pa or less. Bump embedding properties of the adhesive layer 11 can be improved by the thermoplastic resin layer 12 having a shear storage modulus at 60° C. of 1.0E+07 or less.

Materials that may be used as the backing material film layer 13 include plastic films such as polyethylene terephthalate, polyethylene, polypropylene and polyester and porous backing materials such as those made from paper, cloth and/or non-woven fabric.

It should be noted that the protective tape is not limited to the composition described above and one or more other layers may be formed on a surface of any layer and/or between any adjacent layers.

Excellent connection properties are achievable with such a protective tape because adhesion of adhesive agent to bumps is suppressed during application to a wafer. Furthermore, bump electrodes can be reinforced by curing the adhesive layer because embedding conditions of the adhesive layer between bumps are favorable.

<2. Method for Manufacturing a Semiconductor Device>

A method for manufacturing a semiconductor device using the aforementioned protective tape will now be described. A method for manufacturing a semiconductor device according to this embodiment includes a protective tape application step of applying a protective tape having an adhesive layer onto a wafer surface having bump electrodes formed thereon, a grinding step of grinding a surface opposite to the surface of application of the protective tape, a peeling step of peeling the protective tape such that the adhesive layer remains and other layers are removed, wherein the protective tape includes the adhesive layer, a thermoplastic resin layer and a backing material film layer in that order, and a modulus ratio of a shear storage modulus of the adhesive layer to a shear storage modulus of the thermoplastic resin layer at an application temperature at which the protective tape is applied is 0.01 or less. A curing step of curing the adhesive layer may be performed before the grinding step, an adhesive tape application step or a dicing step.

An embodiment of the method for manufacturing a semiconductor device will now be described. In this embodiment of the method for manufacturing a semiconductor device, the protective tape is used and the curing step is performed between the adhesive tape application step and the dicing step. Thus, this embodiment of the method for manufacturing a semiconductor device includes a protective tape application step (A), a grinding step (B), an adhesive tape application step (C), a protective tape peeling step (D), a curing step (E) of curing the adhesive layer, a dicing step (F), an expansion step (G), a pick-up step (H) and a mounting step (I).

(A) Protective Tape Application Step

Figure 2:
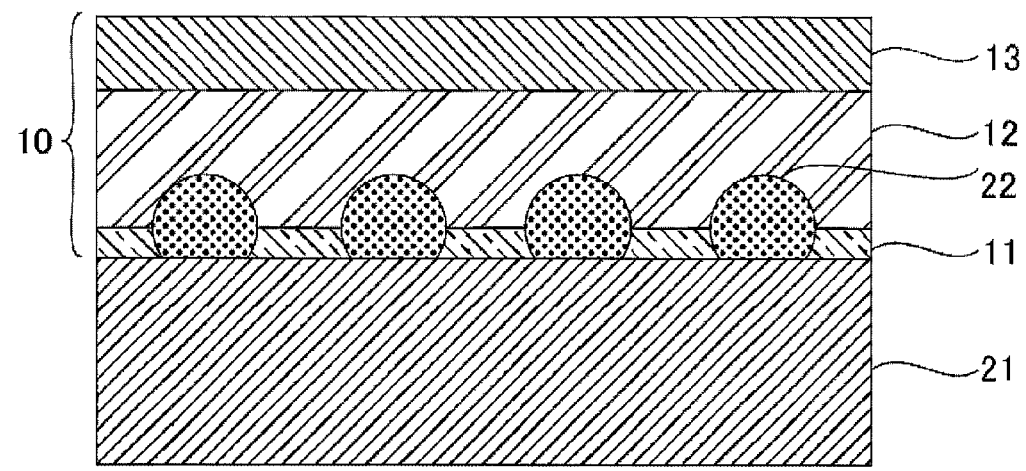
FIG. 2 is a schematic cross-sectional view illustrating a protective tape application step.

FIG. 2 is a schematic cross-sectional view illustrating the protective tape application step. In the protective tape application step, the protective tape 10 is applied to a surface of a wafer 21 having bump electrodes 22 formed thereon. An application temperature at which the protective tape 10 is applied is between 25° C. and 100° C. and preferably between 40° C. and 80° C. in view of reducing voids, improving adhesion to the wafer and preventing warping after wafer grinding.

The wafer 21 includes an integrated circuit formed on a semiconductor surface made from such materials as silicon, and the bump electrodes 22, which are for making connections and are known as bumps. Thickness of the wafer 21 is not particularly limited but is preferably 200 to 1000 µm.

Without particular limitation, examples of the bump electrodes 22 include solder-containing low-melt-point bumps and high-melt-point bumps including tin bumps, silver-tin bumps, silver-tin-copper bumps, gold bumps and copper bumps. Height of the bump electrodes 22 is not particularly limited but is preferably between 10 and 200 µm.

The protective tape 10 is applied so that the adhesive layer 11 is in contact with the surface side on which the bump electrodes 22 have been formed. Because thickness of the adhesive layer 11 of the protective tape 10 is between 10% and 80% of the bump electrodes 22, the bump electrodes 22 penetrate the adhesive layer 11 and embed in the thermoplastic resin layer 12.

(B) Grinding Step

Figure 3:
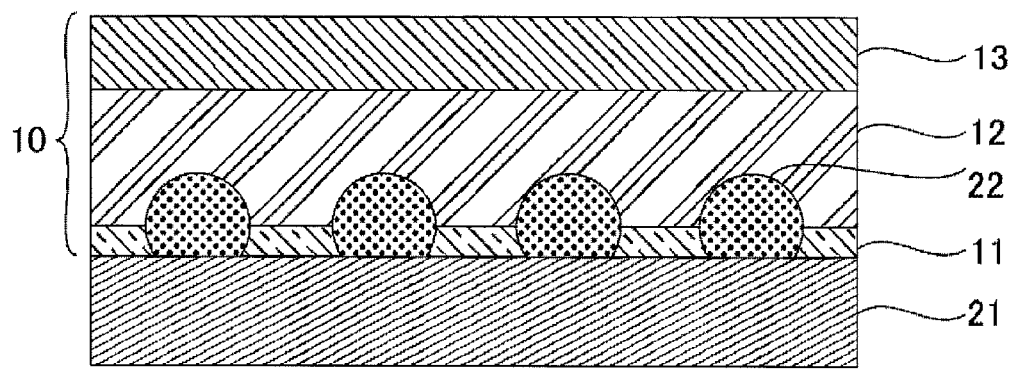
FIG. 3 is a schematic cross-sectional view illustrating a grinding step.

FIG. 3 is a schematic cross-sectional view illustrating the grinding step. In the grinding step, grinding is performed on a side opposite to the side of application of the protective tape 10. The side of the wafer 21 opposite to the side of application of the protective tape 10 is secured to a grinding device and is ground. Grinding is typically performed on the wafer 21 to a thickness of between 50 µm and 600 µm; however, in this embodiment, grinding may be performed to a thickness of 50 µm or less because the adhesive layer 11 reinforces the bump electrodes 22.

(C) Adhesive Tape Application Step

Figure 4:
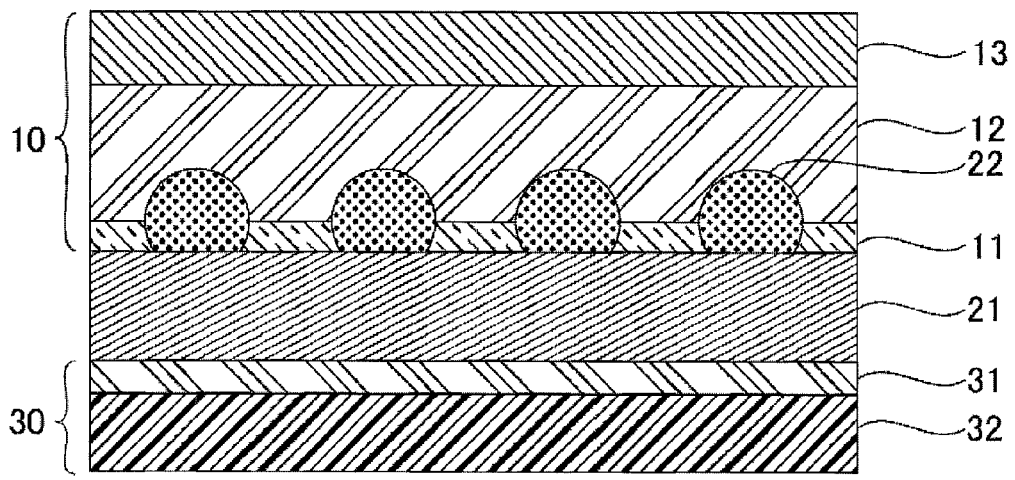
FIG. 4 is a schematic cross-sectional view illustrating an adhesive tape application step.

FIG. 4 is a schematic cross-sectional view illustrating the adhesive tape application step. In the adhesive tape application step, an adhesive tape 30 is applied onto the surface that was ground. The adhesive tape 30, which is known as dicing tape, is a tape for protecting and securing the wafer 21 in the dicing step (F) and retaining the wafer 21 until the pick-up step (H).

Without particular limitation, known materials may be used as the adhesive tape 30. The adhesive tape 30 typically includes an adhesive layer 31 and a backing material film layer 32. Examples of adhesives which may be used in the adhesive layer 31 include polyethylene types, acrylic types, rubber types and urethane types, among others. Plastic films such as polyethylene terephthalate, polyethylene, polypropylene and polyester and porous backing materials such as those made from paper, cloth and/or non-woven fabrics may be used as the backing material film layer 32. Adhesive tape application device and conditions are without particular limitations and known devices and conditions may be used.

(D) Protective Tape Peeling Step

Figure 5:
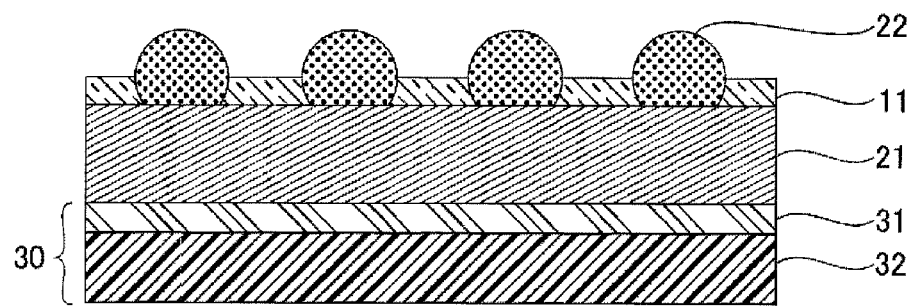
FIG. 5 is a schematic cross-sectional view illustrating a peeling step of a protective tape.

FIG. 5 is a schematic cross-sectional view illustrating the protective tape peeling step. In the protective tape peeling step, the protective tape 10 is peeled such that the adhesive layer 11 remains and other layers are removed. Thus, the thermoplastic resin layer 12 and backing material film layer 13 are removed and only the adhesive layer 11 remains on the wafer 21.

(E) Curing Step

Figure 6:
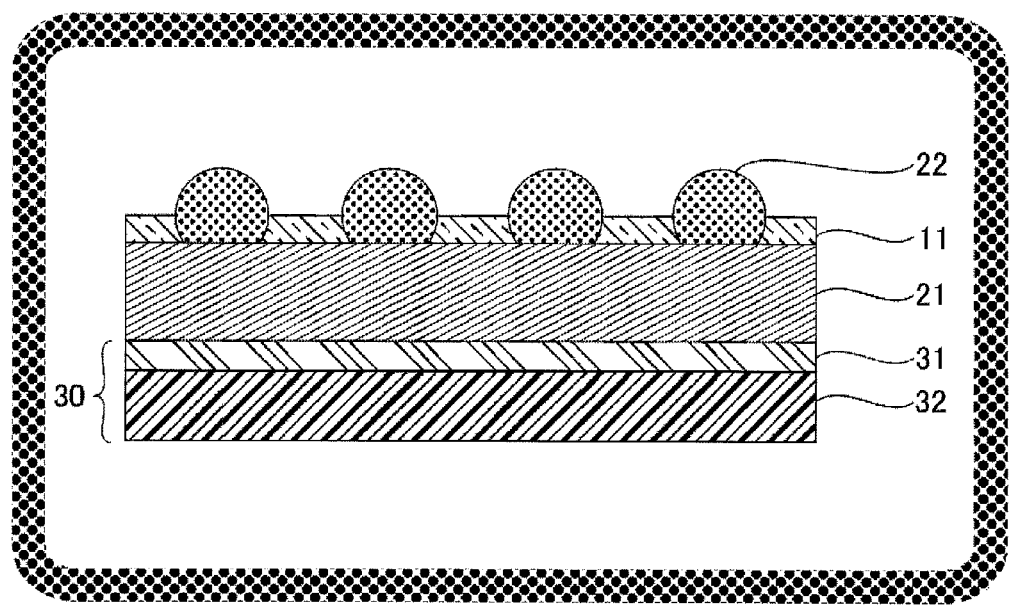
FIG. 6 is a schematic cross-sectional view illustrating a curing step.

FIG. 6 is a schematic cross-sectional view illustrating the curing step. In the curing step, the adhesive layer 11 is cured. Conventional methods of curing thermosetting type adhesive agents may be used as a curing method and curing conditions.

(F) Dicing Step

Figure 7:
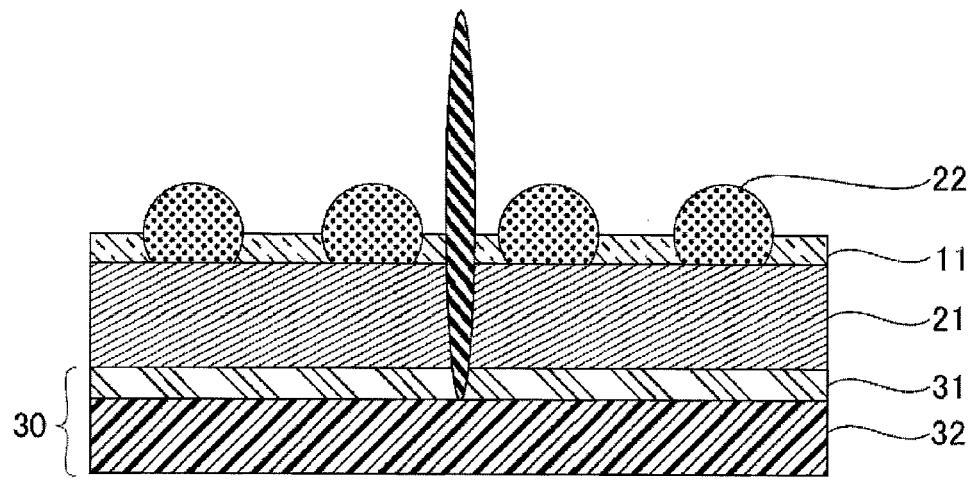
FIG. 7 is a schematic cross-sectional view illustrating a dicing step.

FIG. 7 is a schematic cross-sectional view illustrating the dicing step. In the dicing step, the wafer 21 having the adhesive tape 30 applied thereon is diced to obtain individual semiconductor chips. Without particular limitation, known methods, such as cutting the wafer 21 apart by using a dicing saw, may be used as a dicing method.

(G) Expansion Step

Figure 8:
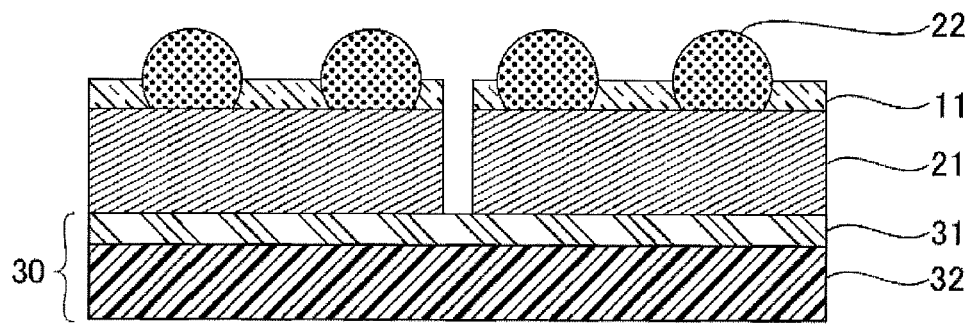
FIG. 8 is a schematic cross-sectional view illustrating an expansion step.

FIG. 8 is a schematic cross-sectional view illustrating the expansion step. In the expansion step, for example, the adhesive tape 30, which has a plurality of separated semiconductor chips adhered thereon, is stretched in a radial direction and space between individual semiconductor chips is widened.

(H) Pick-Up Step

Figure 9:
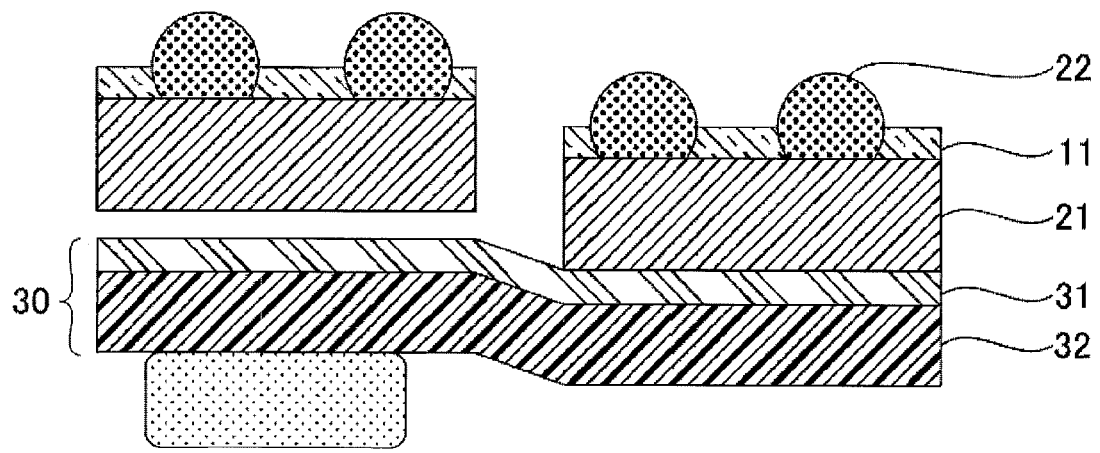
FIG. 9 is a schematic cross-sectional view illustrating a pick-up step.

FIG. 9 is a schematic cross-sectional view illustrating the pick-up step. In the pick-up step, semiconductor chips adhesively secured on the adhesive tape 30 are detached by lifting up from the bottom surface of the adhesive tape 30 and detached chips are attached to a collet by suction. The semiconductor chips having undergone pick-up are either collected in a chip tray or conveyed to a chip-mounting nozzle of a flip-chip bonder.

(I) Mounting Step

Figure 10:
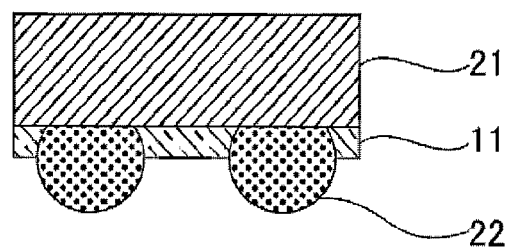
FIG. 10 is a schematic cross-sectional view illustrating a mounting step.

FIG. 10 is a cross-sectional view illustrating the mounting step. In the mounting step, for example, the semiconductor chips are connected to a circuit substrate by using a circuit connection material such as NCF (Non Conductive Film) Without particular limitation, plastic substrates such as polyamide substrates, glass epoxy substrates or ceramic substrates, among others, may be used as the circuit substrate. Without particular limitation, plastic substrates such as polyimide substrates, glass epoxy substrates or ceramic substrates, among others, may be used as the circuit substrate. Known methods of using a thermal bonder or a reflow oven, among others, may be used as a connection method.

In such a method for manufacturing a semiconductor device, damage to bump electrodes in such post-processing steps as the dicing, pick-up and mounting steps can be reduced because the bump electrodes are reinforced by curing the adhesive layer before the dicing step on the wafer surface having the bump electrodes formed thereon. Thus, high yield rates of semiconductor devices having excellent connection reliability properties are achievable. Furthermore, an achievable semiconductor device includes a semiconductor chip having bump electrodes and an adhesive layer formed on a bump electrode formation surface and a circuit substrate having electrodes corresponding to the bump electrodes; excellent connection reliability properties can be achieved by forming the adhesive layer 11 on the bump electrode formation surface of the semiconductor chip.

EXAMPLES

<2. Examples>

Examples of the present invention are explained below. A protective tape was manufactured in these examples by laminating an adhesive layer and a thermoplastic resin layer. Semiconductor devices were manufactured by using the protective tape and sequentially performing a protective tape application step (A), a grinding step (B), an adhesive tape application step (C), a protective tape peeling step (D), a curing step (E), a dicing step (F), an expansion step (G), a pick-up step (H) and a mounting step (I). Solder bonding properties and bump embedding properties of the semiconductor device were then evaluated. It should be noted that the present invention is not limited by these examples.

Protective Tape Manufacturing

As presented in Table 1, adhesive layers A1 to A3 were manufactured. The adhesive layer A1 was manufactured by blending a film-forming resin at 13.0 pts. mass, an epoxy resin at 54.8 pts. mass, a curing agent at 32.4 pts. mass and a curing accelerator at 0.3 pts. mass to prepare an adhesive agent composition which was then applied to a PET (polyethylene terephthalate) material treated to be detachable by using a bar coater and dried in an oven to achieve an after-drying thickness of 30 μm. Shear storage modulus of the adhesive layer A1 at 60° C. was 3.3E+03 Pa.

The adhesive layer A2 was manufactured by blending a film-forming resin at 13.0 pts. mass, an epoxy resin at 54.8 pts. mass, a curing agent at 32.4 pts. mass, a curing accelerator at 0.3 pts. mass and a filler at 25.0 pts. mass to prepare an adhesive agent composition which was then applied to a PET (polyethylene terephthalate) material treated to be detachable by using a bar coater and dried in an oven to achieve an after-drying thickness of 30 μm. Shear storage modulus of the adhesive layer A2 was 3.4E+04 Pa at 60° C.

The adhesive layer A3 was manufactured by blending a film-forming resin at 2.0 pts. mass, an epoxy resin at 54.8 pts. mass, a curing agent at 32.4 pts. mass and a curing accelerator at 0.3 pts. mass to prepare an adhesive agent composition which was then applied to a PET (polyethylene terephthalate) material treated to be detachable by using a bar coater and dried in an oven to achieve an after-drying thickness of 30 μm. Shear storage modulus of the adhesive layer A3 was 3.6E+01 Pa at 60° C.

TABLE 1

|  | A1 | A2 | A3 |
|---|---|---|---|
| Film-forming resin | 13.0 | 13.0 | 2.0 |
| Epoxy resin | 84.8 | 54.8 | 54.8 |
| Curing agent | 32.4 | 32.4 | 32.4 |
| Curing accelerator | 0.3 | 0.3 | 0.3 |
| Filler | — | 25.0 | — |
| Total | 100.0 | 125.0 | 89.0 |
| Filler amount [wt %] | — | 20.0 | — |
| Compressive elastic modulus [Pa] | 3.30E+03 | 3.60E+04 | 3.60E+01 |

Film forming resin: phenoxy resin (PKHH, Union Carbide Corporation)

Epoxy resin: sicyclopentadiene epoxy resin (HP7200H, DIC Corporation)

Curing agent: novolac phenol resin (TD-2093 DIC Corporation)

Curing accelerator: 2-ethyl-4-methylimidazole (2E4MZ)

Filler: silica (Aerosil RY 200, Nippon Aerosil Co., Ltd.)

Thermoplastic resin layers B1 to B3 were manufactured in the following manner A thermoplastic resin described below was extrusion molded onto a PET substrate (thickness: 75 μm) to achieve a thickness of 500 μm after drying. Shear storage modulus of the thermoplastic resin layer B1 was 1.2E+06 Pa at 60° C., shear storage modulus of the thermoplastic resin layer B2 was 1.4E+05 Pa at 60° C. and shear storage modulus of the thermoplastic resin layer B3 was 1.7E+07 Pa at 60° C.

Thermoplastic resin layer B1: propylene-olefin copolymer resin (Notio PN0040 Mitsui Chemicals, Inc.)

Thermoplastic resin layer B2: α-olefin copolymer (TAFMER P0275, Mitsui Chemicals, Inc.)

Thermoplastic resin layer B3: linear low-density polyethylene (Novatec UF943, Japan Polyethylene Corporation)

One of the adhesive layers A1 to A3 and one of the thetmoplastic resin layers B1 to B3 were selected and laminated to manufacture protective tapes.

A viscoelasticity measuring device was used to measure and calculate shear storage modulus G' at 60° C. Measurement conditions were set at a measurement temperature range of 0° C. to 120° C., a temperature increase rate of 5° C./min, a vibration frequency of 1 Hz and a deformation of 0.1%.

Semiconductor Device Manufacturing

The adhesive layer surface of the protective tape was applied onto a wafer (size: 5 cm×5 cm×725 μmt) having solder bumps (φ=250 μm, H=200 μm, pitch=250 μm) formed thereon and lamination was performed at 60° C. by using a vacuum type laminator.

Next, back grinding was performed to a wafer thickness of 300 μm by using a DFG8560 manufactured by DISCO Corporation. Subsequently, the protective tape was peeled such that the adhesive layer remained and other layers were removed, the adhesive layer on the wafer was cured by using an oven at a temperature of 130° C. for two hours. The wafer was then diced and after the chips were separated, a mounter was used to mount the chips to substrates (gold electrodes with flux) and a reflow oven at a maximum temperature of 260° C. was used to solder bond the chips to the substrates.

Solder Bonding Property Evaluation

Flux was applied to the gold electrodes on the substrates and solder wet-spreading surface area was measured at the maximum temperature of 260° C. during solder bonding using the reflow oven and calculated with bump size as a reference value of 100%.

Bump Embedding Property Evaluation

A microscope (100×) was used for observation and products not having gaps between the adhesive layer and the bumps were evaluated as passing, hereinafter denoted as "P", and products having such gaps were evaluated as irregular, hereinafter denoted as "I". It should be noted that the bump embedding property was evaluated only in samples having a solder bonding property evaluation of 80% or more.

Example 1

As presented in Table 2, the adhesive layer A1 and the thermoplastic resin layer B1 were laminated and a protective tape having a modulus ratio of the adhesive layer to the thermoplastic resin layer of 2.8E-03 was manufactured. Using this protective tape, a semiconductor device was manufactured by using the previously described method and evaluations were a solder bonding property of 105% and a bump embedding property of "P".

Example 2

As presented in Table 2, the adhesive layer A2 and the thermoplastic resin layer B3 were laminated and a protective tape having a modulus ratio of the adhesive layer to the thermoplastic resin layer of 2.1E-03 was manufactured. Using this protective tape, a semiconductor device was manufactured by using the previously described method and evaluations were a solder bonding property of 85% and a bump embedding property of "I".

Example 3

As presented in Table 2, the adhesive layer A3 and the thermoplastic resin layer B1 were laminated and a protective tape having a modulus ratio of the adhesive layer to the thermoplastic resin layer of 3.0E-05 was manufactured. Using this protective tape, a semiconductor device was manufactured by using the previously described method and evaluations were a solder bonding property of 110% and a bump embedding property of "P".

As presented in Table 2, the adhesive layer A1 and the thermoplastic resin layer B2 were laminated and a protective tape having a modulus ratio of the adhesive layer to the thermoplastic resin layer of 2.4E-02 was manufactured. Using this protective tape, a semiconductor device was manufactured by using the previously described method and evaluation was a solder bonding property of 12%.

Comparative Example 2

As presented in Table 2, the adhesive layer A2 and the thermoplastic resin layer B1 were laminated and a protective tape having a modulus ratio of 3.0E-02 of the adhesive layer to the thermoplastic resin layer was manufactured. Using this protective tape, a semiconductor device was manufactured by using the previously described method and evaluation was a solder bonding property of 3%.

TABLE 2

|  | Ex. 1 | Ex. 2 | Ex. 3 | Com. 1 | Com. 2 |
| --- | --- | --- | --- | --- | --- |
| Adhesive layer | A1 | A2 | A3 | A1 | A2 |
| Thermoplastic resin | B1 | B3 | B1 | B2 | B1 |
| 60° C. compressive Adhesive layer [Pa] | 3.3E+03 | 3.6E+04 | 3.6E+01 | 3.3E+03 | 3.6E+04 |
| elastic modulus Thermoplastic resin [Pa] | 1.2E+06 | 1.7E+07 | 1.2E+06 | 1.4E+05 | 1.2E+06 |
| Compressive elastic modulus ratio (A/B) | 2.8E−03 | 2.1E−03 | 3.0E−05 | 2.4E−02 | 3.0E−02 |
| Solder bonding property [%] | 105 | 85 | 110 | 12 | 3 |
| Bump embedding property | P | I | P | — | — |

As in the Comparative Examples 1 and 2, a good solder bonding property was not achievable in cases where the modulus ratio (A/B) exceeded 0.01 at 60° C. In contrast, as in the Comparative Examples 1 to 3, a good bonding property was obtainable in cases where the modulus ratio (A/B) was 0.01 or less at 60° C. Furthermore, as in the Examples 1 and 3, it was found that good bump embedding properties were obtainable by a shear storage modulus of the thermoplastic resin layer at 60° C. being 1.0E+07 Pa or less.

EXPLANATION OF REFERENCES

10 protective tape, 11 adhesive layer, 12 thermoplastic resin layer, 13 backing material film layer, 21 wafer, 22 bump electrodes, 30 adhesive tape, 31 adhesive layer, 32 backing material film layer

The invention claimed is:
1. A method for manufacturing a semiconductor device comprising:
a protective tape application step of applying a protective tape having an adhesive layer onto a surface of a wafer having a bump electrode formed thereon, the protective tape comprising the adhesive layer, a thermoplastic resin layer and a backing material film layer in that order;
a grinding step of grinding a surface of the wafer opposite to the surface of the wafer onto which the protective tape is applied; and
a peeling step of peeling the protective tape such that the adhesive layer remains and the thermoplastic resin layer and the backing material film layer are removed;
wherein the adhesive layer comprises a phenoxy resin, an epoxy resin and a curing agent, and a modulus ratio of a shear storage modulus of the adhesive layer when a thickness of the adhesive layer is 30 μm to a shear storage modulus of the thermoplastic resin layer when a thickness of the thermoplastic resin layer is 500 μm at an application temperature at which the protective tape is applied, a temperature increase rate of 5° C./min, a vibration frequency of 1 Hz and a deformation of 0.1% is 0.01 or less.

2. The method for manufacturing a semiconductor device according to claim 1 further comprising:
an adhesive tape application step of applying an adhesive tape onto a surface of the wafer on which the grinding was performed;
a dicing step of dicing the wafer having the adhesive tape applied thereon into individual semiconductor chips; and
a curing step of curing the adhesive layer;
wherein the curing step is performed before the dicing step.

3. A semiconductor device manufactured by the method for manufacturing a semiconductor device according to claim 2.

4. The method for manufacturing a semiconductor device according to claim 2, wherein the application temperature is between 40° C. and 80° C.

5. The method for manufacturing a semiconductor device according to claim 2, wherein the shear storage modulus of the thermoplastic resin layer at 60° C. is 1.0E+07 Pa or less.

6. The method for manufacturing a semiconductor device according to claim 2, wherein the shear storage modulus of the adhesive layer is between 1.0E+01 Pa and 1.0E+05 Pa.

7. The method for manufacturing a semiconductor device according to claim 2, wherein the shear storage modulus of the adhesive layer at 60° C. is between 1.0E+01 Pa and 1.0E+05 Pa.

8. The method for manufacturing a semiconductor device according to claim 2, wherein the adhesive layer is applied onto a wafer surface having a bump electrode formed thereon; and
the thickness of the adhesive layer is between 10% and 80% relative to a height of the bump electrode.

9. A semiconductor device manufactured by the method for manufacturing a semiconductor device according to claim 1.

* * * * *